US010642602B2

(12) United States Patent
Roy et al.

(10) Patent No.: US 10,642,602 B2
(45) Date of Patent: May 5, 2020

(54) NVM ARCHITECTURE WITH OTA SUPPORT

(71) Applicant: NXP USA, Inc., Austin, TX (US)

(72) Inventors: Anirban Roy, Austin, TX (US); Anis M. Jarrar, Austin, TX (US); Frank K. Baker, Jr., Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/839,193

(22) Filed: Dec. 12, 2017

(65) Prior Publication Data
US 2019/0179629 A1    Jun. 13, 2019

(51) Int. Cl.
| | |
|---|---|
| *G06F 9/445* | (2018.01) |
| *G06F 8/654* | (2018.01) |
| *G06F 3/06* | (2006.01) |
| *H04L 29/08* | (2006.01) |
| *H03M 7/30* | (2006.01) |

(52) U.S. Cl.
CPC .............. *G06F 8/654* (2018.02); *G06F 3/064* (2013.01); *G06F 3/0688* (2013.01); *G06F 9/445* (2013.01); *H03M 7/30* (2013.01); *H04L 67/12* (2013.01); *H04L 67/34* (2013.01); *G06F 9/44505* (2013.01)

(58) Field of Classification Search
CPC ........ G06F 8/654; G06F 3/064; G06F 3/0688; G06F 9/445
See application file for complete search history.

(56) References Cited

U.S. PATENT DOCUMENTS

| | | | | |
|---|---|---|---|---|
| 6,879,266 | B1 * | 4/2005 | Dye ........................ | G06F 12/08 341/51 |
| 7,292,164 | B1 * | 11/2007 | Wegener ............... | G06F 17/141 341/76 |
| 8,479,180 | B2 | 7/2013 | Rajaram et al. | |
| 2001/0038642 | A1 * | 11/2001 | Alvarez, II ............. | H03M 7/30 370/477 |
| 2004/0088473 | A1 * | 5/2004 | Ogle ..................... | G06F 9/3001 711/100 |

(Continued)

FOREIGN PATENT DOCUMENTS

CN            106406935 A      2/2017

OTHER PUBLICATIONS

Tithe: A lossless data compression and decompression algorithm and its hardware architecture; author: MB Lin etal, published on 2006.*

(Continued)

*Primary Examiner* — Chameli Das

(57) ABSTRACT

A software update architecture, system, apparatus, and methodology are provided for performing block-based swapping of OTA software stored as a plurality of compressed blocks in a first, smaller NVM with the system software stored as a plurality of decompressed blocks in a second, larger NVM by using a first decompressor circuit and first scratch memory to sequentially decompress each compressed code block of OTA software for storage in decompressed form as updated system software in the second, larger NVM while using a first compressor circuit and second scratch memory to sequentially compress each decompressed code block of system software for storage in compressed form as backup system software in the first, smaller NVM.

18 Claims, 3 Drawing Sheets

(56) References Cited

U.S. PATENT DOCUMENTS

| | | | |
|---|---|---|---|
| 2007/0033377 A1* | 2/2007 | Sinclair | G06F 3/0605 |
| | | | 711/203 |
| 2007/0049263 A1* | 3/2007 | Rajaram | G06F 9/44521 |
| | | | 455/418 |
| 2007/0083571 A1* | 4/2007 | Meller | G06F 8/654 |
| 2007/0294685 A1* | 12/2007 | Oh | G06F 8/658 |
| | | | 717/168 |
| 2008/0001789 A1* | 1/2008 | Dover | G06F 9/445 |
| | | | 341/50 |
| 2010/0030823 A1* | 2/2010 | Meller | G06F 8/654 |
| | | | 707/E17.044 |
| 2011/0252183 A1* | 10/2011 | Cho | H03M 7/30 |
| | | | 711/102 |
| 2014/0189421 A1* | 7/2014 | Werner | G06F 11/2056 |
| | | | 714/6.21 |
| 2014/0281344 A1* | 9/2014 | Shin | G06F 12/02 |
| | | | 711/171 |
| 2015/0089121 A1* | 3/2015 | Coudhury | G06F 12/0246 |
| | | | 711/103 |
| 2015/0100556 A1* | 4/2015 | Sekiguchi | H03M 7/30 |
| | | | 707/693 |
| 2016/0088189 A1* | 3/2016 | Atsumi | H04N 1/41 |
| | | | 358/1.17 |
| 2016/0253245 A1* | 9/2016 | Karuppiah | G06F 11/2038 |
| | | | 707/643 |
| 2017/0220291 A1* | 8/2017 | Jiang | G06F 9/50 |
| 2017/0286153 A1* | 10/2017 | Bak | G06F 9/485 |
| 2018/0138921 A1* | 5/2018 | Arelakis | H03M 7/6088 |
| 2018/0260338 A1* | 9/2018 | Krishnappa | G06F 16/258 |
| 2018/0341722 A1* | 11/2018 | Satpathy | G06F 16/90339 |
| 2018/0343204 A1* | 11/2018 | Zhuang | H04L 47/22 |
| 2019/0034091 A1* | 1/2019 | Arelakis | G06F 3/0673 |
| 2019/0260388 A1* | 8/2019 | Wegener | G06F 9/3877 |

OTHER PUBLICATIONS

Title: A block-based inter-band lossless hyperspectral image compressor, author: M Slyz et al, published on 2005.*

Jack Venbrux et al, A VLSI Chip Set for High-Speed Lossless Data Compression, IEEE Transactions on Circuit and Systems for Video Technology, vol. 2, No. 4, Dec. 1992.

Nazish Aslam, Code Compression and Decompression for Coarse-Grain Reconfigurable Architectures, IEEE Transactions on Very Large Scale Integration (VLSI) Systems, vol. 16, No. 12, Dec. 2008.

Maclain Lobdell, Freescale Semiconductor, Robust Over-the-Air Firmware Updates Using Program Flash Memo Swap on Kinetis Microcontrollers, Document No. AN 4533, Rev. 0, Jun. 2012.

Daniel McKenna, NXP Semiconductors N.V., Making Full Vehicle OTA Updates a Reality, whitepaper, May 2016.

Jose Luis Nunez et al., Gbit/s Lossless Data Compression Hardware, IEEE Transactions on Very Large Scale Integration (VLSI) Systems, vol. 11, No. 3, Jun. 2003.

* cited by examiner

NVM ARCHITECTURE WITH OTA SUPPORT

BACKGROUND OF THE INVENTION

Field of the Invention

The present invention is directed in general to the field of memory systems. In one aspect, the present invention relates generally to a system and method for updating memories.

Description of the Related Art

With microcontrollers used in mobile devices or other field applications, there are increasingly conflicts between the coded microcontroller functionality and device design, manufacture, and performance. For example, as microcontrollers, including automotive microcontrollers, are increasingly required to support over the air (OTA) updates for the microcontroller code, conventional OTA solutions require a doubling of the non-volatile memory (NVM) size along with other design constraints and performance drawbacks, such as lengthy device downtimes required for update operations to change the executable code once the OTA update is finished, significant data bandwidth requirements for data downloads operations, processing power consumption, and limited backup capability to protect against download errors. The conflicts between design constraints and performance requirements can adversely affect the ability of microcontrollers to perform update or maintenance tasks since they consume significant computing resources, effectively introducing computing resource "dead weight" in the form of duplicate NVM memories, which are needed for update/maintenance and cannot be used for general application work. As seen from the foregoing, the existing solutions for updating microcontroller code in memory are extremely difficult at a practical level by virtue of the difficulty balancing the design constraints for providing a cost efficient microcontroller configuration having a smaller non-volatile memory with the performance demands for implementing the microcontroller functionality. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

A software update architecture, system, apparatus, and methodology are described for leveraging a backup non-volatile memory (NVM) that is smaller than a main execution NVM to securely perform application update and/or maintenance operations using the main execution NVM to store current code in uncompressed form and using the smaller backup NVM to store OTA code or old code in compressed form. In selected embodiments, an OTA management engine is disclosed which uses a first scratch memory (scratch SRAM) and lossless compression engine in an iterative process to retrieve and compress blocks from the main execution NVM for storage in the smaller backup NVM, while simultaneously using a second scratch memory (scratch NVM) and lossless decompression engine to retrieve and decompress blocks from the smaller backup NVM for storage in the main execution NVM. By properly choosing the block size and lossless compression/decompression engines and sequencing the process to swap blocks between the main and backup NVMs, the size of the backup NVM may be reduced to 50% of the size of the main execution NVM without adding big delay time to change the executable code once the OTA update is finished by hiding the compression/decompression time within the write time of the NVM memory.

Figure 1:
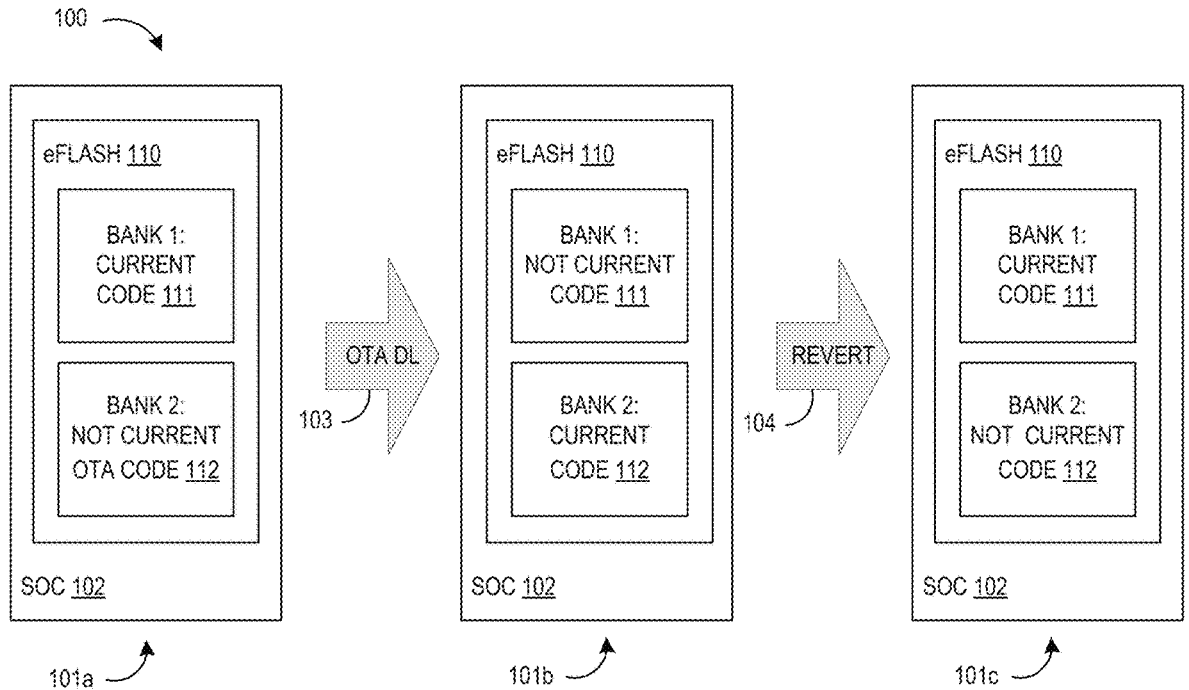
FIG. 1 is a schematic block diagram depiction of a conventional approach for updating a computer system.

To provide a contextual understanding for selected embodiments of the present disclosure, reference is now made to FIG. 1 which depicts a schematic block diagram 100 of a conventional "A/B" approach for updating a computer system 102, such as a system-on-chip automotive microcontroller on which an embedded Flash (eFlash) memory 110 includes two, equal-sized NVM banks 111, 112. In a first mode 101a, the first NVM bank (Bank 1) 111 is used to store the "current" or active code that is executed by the computer system 102 in normal operation, and the second NVM bank (Bank 2) 112 is used in the background to store any new OTA code which is designated as "not current." Once the update is complete, the computer system 102 can change to use the newly updated firmware second NVM bank (Bank 2) 112 at a convenient time (e.g., at next key-on). In order to store the new OTA code when downloaded in uncompressed form, the second NVM bank (Bank 2) 112 must have the same size as the first NVM bank (Bank 1) 111. Even if the over-the-air download (OTL DL) process 103 to the second NVM bank (Bank 2) 112 is slow, the computer system 102 can continue operation using the "current" code stored in the first NVM bank (Bank 1) 111. Upon completion of the OTA DL process 103, the NVM banks 111, 112 may be quickly switched at the computer system 102 during a second mode 101b, requiring approximately 5-10 ns in order to switch or select the new eFlash bank. After the switch, the active code (e.g., updated code) stored in the second NVM bank (Bank 2) 112 is designated as "current" and is executed by the computer system 102, while the old or "not current" code (e.g., non-updated code) that is stored in the first NVM bank (Bank 1) 111 is designated as "not current." However, if there is any error associated with the updated code stored in the second NVM bank (Bank 2) 112, then a reversion process 104 may be performed to revert to the non-updated code so that the computer system 102 switches back in a third mode 101c to use the old code in the first NVM bank (Bank 1) 111 as the "current" code while leaving the updated code in the second NVM bank (Bank 2) 112, but now designated as "not current." With the "A/B" approach where there is always a working firmware stored in one of the NVM banks 111, 112, there is no danger of putting the computer system into an inoperable state as it will always be possible to quickly "roll-back" to the previous working firmware, albeit at cost of implementing two times the execution flash on the computer system. Even when embodied with an external Flash memory banks to load and update an onboard SRAM memory, the ability to quickly switch between NVM banks comes at the cost of a doubling in the NVM memory density.

Figure 2:
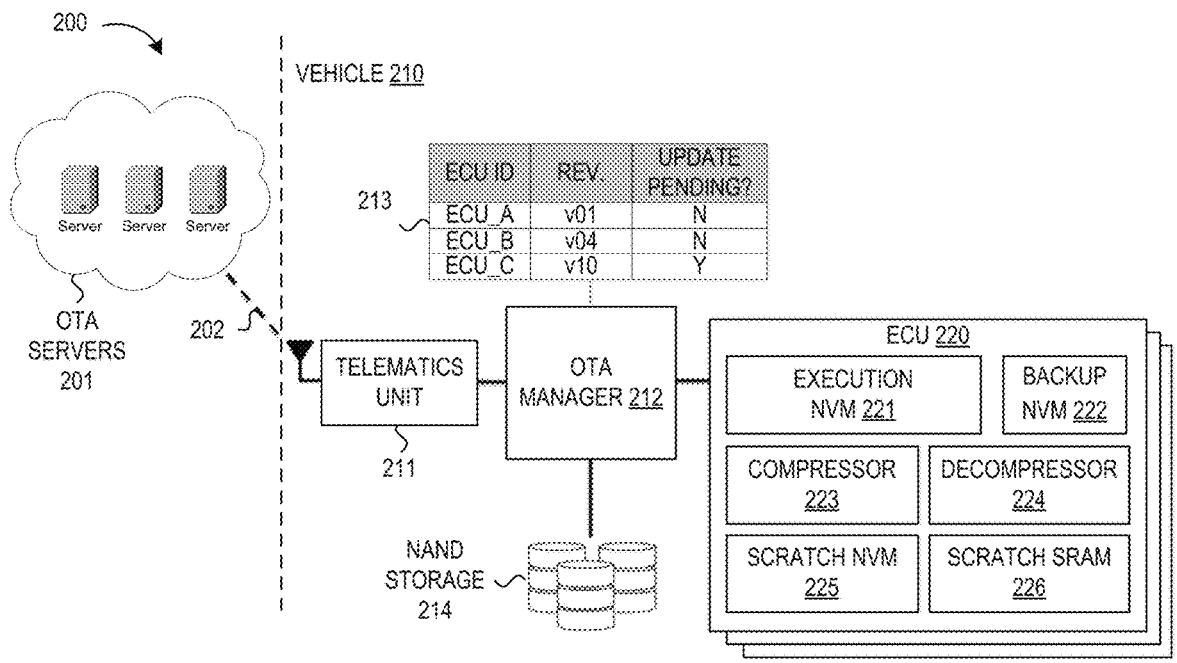
FIG. 2 diagrammatically depicts an update flow overview for an in-the-field software update in accordance with selected embodiments of the present disclosure.

To provide additional details for an improved understanding of selected embodiments of the present disclosure, reference is now made to FIG. 2 which diagrammatically depicts an update flow overview 200 for an in-the-field software update of an automotive microcontroller in accordance with selected embodiments of the present disclosure. In this example application, it will be appreciated that there are many advantages to being able to perform in-the-field software updates to automotive microcontrollers in cars, including saving manufacturers money, enabling critical bugs to be patched immediately, and allowing compelling new features to be added to the vehicle at any time during its lifecycle. While there are some vehicle applications that can receive OTA updates, these are typically limited to infotainment or telematics systems, and any faults in the firmware controlling a critical function (e.g., the brakes or an airbag) usually require that the vehicle is returned to the dealership for repair. As a result, there are challenges with updating the Electronic Control Units (ECUs) that control key features like the engine, brakes, steering, since the) are located deeper within the vehicle network architecture, and typically include small amounts of embedded flash and RAM.

To address one or more of the problems arising from the conventional approaches for correcting or updating software in the field, there is disclosed herein a system, method, and apparatus for conveying an update file from the OEM's servers 201 to a specific ECU 220 within a vehicle without requiring doubling of the ECU NVM storage. In the depicted example, a secure connection 202 is set up over a cellular network between the server(s) 201 and an individual vehicle 210. This allows the new, updated, firmware to be sent securely to the vehicle's Telematics Unit 211, and then on to the OTA Manager 212. The OTA Manager 212 manages the update process for all ECUs 220 within the vehicle 210. It controls the distribution of firmware updates to ECUs 220 and will tell the ECU when to perform the update. Once the update process is complete, the OTA manager 212 will send confirmation to the OEM.

To facilitate the update operations, a backup non-volatile memory may be provided, either as an external NVM memory 214 (e.g., NAND flash) or an embedded NVM memory 222 at the ECU 220, which the OTA manager 212 or ECU 220 uses to store the firmware update in compressed form until required or used for a software update. As disclosed herein, the backup non-volatile memory may also be used to store backup copies of non-updated versions of the software in compressed form which can be called upon in the case of a major fault in a software update so that each ECU always has access to working firmware.

To manage software update operations, the OTA Manager 212 may include a table 213 of every ECU within the vehicle 210, including information such as ECU identifiers (ECU_ID), serial numbers, current firmware version, and status information on whether an update is pending. This allows the OTA Manager 212 to verify firmware updates which arrive and ensure that they are authorized for use in the vehicle 210. To securely download an update, the telematics unit 211 sets up the connection 202 to the OEM server 201 using any desired security protocol, such as the Transport Layer Security (TLS) standard that is widely used in online banking to secure communications. The (secured) update file is then received by the OTA Manager 212 which will have a table listing 213 of each ECU 220 on the vehicle 210 along with serial number and current firmware version number. This allows it to verify that the update is valid for this vehicle. If desired, security protection may also require that the update files should be end-to-end secured between the OEM server(s) 201 and the target ECU 220, either by using decryption and authentication functionality at the ECU 220 or OTA manager 212 as needed. Acting as a gateway bridge between the many internal networks of the vehicle 210 and the external networks of the outside world, the OTA manager 212 may be embodied with software which securely manages updates across the same bridge while providing isolation from external interfaces that a hacker may use to attempt to gain access to the vehicle 210. In selected embodiments, the OTA manager 212 is embodied with compact, trusted auto-grade OEM code and a secure boot process that will be used so that only firmware signed by the OEM can be executed on the device, in contrast to a conventional telematics or infotainment unit which can contain multiple interfaces (e.g., cellular, Wi-Fi, USB, DVD), increasing the chances of a potential backdoor attack.

As for the actual software update operations, each ECU 220 includes a number of specific hardware features, including execution NVM storage 221, backup NVM storage 222, compressor 223, decompressor 224, scratch NVM 225, and scratch SRAM 226. Whether embodied as embedded flash memory or some other type of non-volatile memory, the execution NVM storage 221 is sized to store the "current" version of active software that is executed by ECU 220 in normal operation, where the current software is broken into n blocks of m bytes. The backup NVM storage 222 may also be embodied with any desired form of non-volatile memory, but is specifically sized to be smaller than the size of the execution NVM storage 221 (e.g., by half) so that the update software can be stored in compressed form for block-based swapping of the update software, where the compressed update software is broken into n blocks of p bytes. As explained hereinbelow, the scratch NVM 225 and scratch SRAM 226 are used to facilitate movement of code between the execution NVM storage 221 and backup NVM storage 222 using the compressor 223 and decompressor 224 to provide loss-less compression/decompression of code, and may be implemented as memory resources that are shared with other blocks of the vehicle 210. While selected embodiments of the nonvolatile memory architecture disclosed herein may account for scenarios where the number of i software blocks stored in the execution NVM storage 221 is equal to the number of j software blocks stored in the backup NVM storage 222 (e.g., i=j=n), this is not necessarily required since a user may have a different number of blocks (e.g., i) in the existing code footprint versus the number of blocks (e.g., j≠i) in the new OTA code footprint. Even with different number of blocks, the NVM memory architecture will still work, even if the compression and decompression do not finish at the same time.

As a first iterative step (i=1) in the software update process, a first (or ith) block (e.g., p bytes) of the compressed update software stored in the backup NVM storage 222 is loaded in compressed form into the scratch NVM storage 225, and a first (or ith) block (e.g., m>p bytes) of the operating software stored in the execution NVM storage 221 is loaded in uncompressed form into the scratch SRAM storage 226. By loading the compressed update software blocks into the scratch NVM storage 225, the update process is protected against brownout-related data loss events. Next, the m-byte block of operating software in the scratch SRAM storage 226 is compacted by the compressor 223 into a p-byte compressed block using any desired lossless compression algorithm, and the resulting compressed block is written to the backup NVM storage 222 where first block of compressed update software was originally located. In addition, the p-byte block of compressed update software in the scratch NVM storage 225 is decompressed by the decompressor 224 into an m-byte decompressed block using any desired lossless decompression algorithm, and the resulting decompressed block is written to the execution NVM storage 221 where first block of (decompressed) operating software was originally located. After incrementing the iterative counter value i, the foregoing sequence of steps is iteratively repeated until i=n, at which point all of the p-byte blocks of compressed update software blocks from the backup NVM storage 222 have been decompressed and swapped with all of the m-byte blocks of the operating software originally stored in the execution NVM storage 221.

In selected embodiments for performing block-based swapping of the update software, each ECU 220 may implement either or both of the execution NVM storage 221 or backup NVM storage 222 with Read-While-Write flash memory to allow read access from a flash block while another block is being erased or programmed, thereby allowing the ECU operations to continue executing during the update process. In addition, the execution NVM storage 221 and backup NVM storage 222 may each have small code flash block sizes in order to improve update speed and efficiency. In addition, lockable flash regions may be configured to provide additional protection to critical code, such as the bootloader during the update process to prevent accidental deletion. In addition, brownout detection may be included to detect unexpected resets during update process which can leave the NVM in an undefined state, at which point a recovery attempt can be launched to revert to the non-updated version of the code (now stored in compressed form in the backup NVM storage 222).

Figure 3:
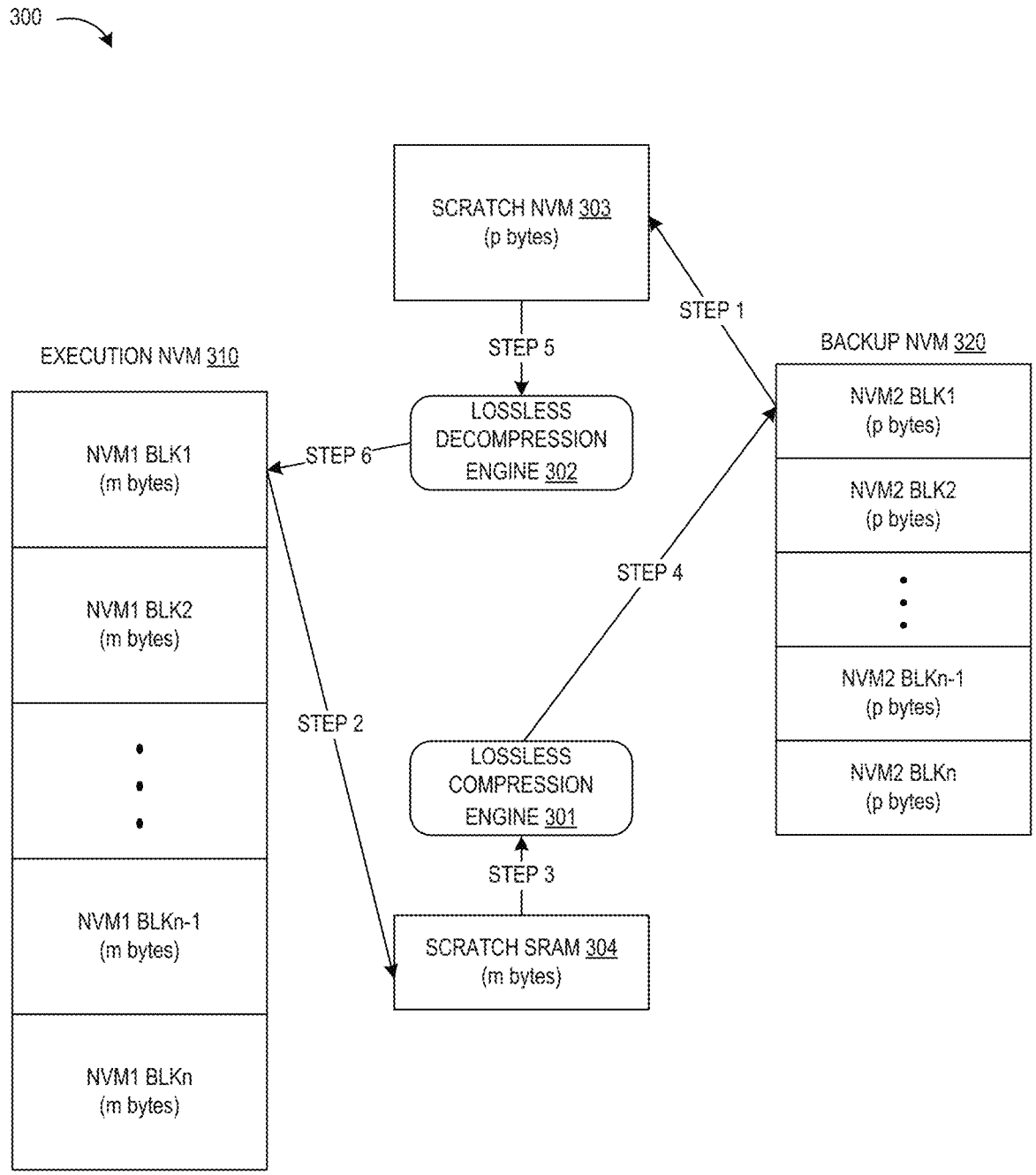
FIG. 3 is a block diagram depiction of an NVM update system and sequence which use a first NVM bank for storing uncompressed execution code and a smaller NVM bank for storing compressed OTA code or backup code in accordance with selected embodiments of the present disclosure.

To provide additional details for an improved understanding of selected embodiments of the present disclosure, reference is now made to FIG. 3 which depicts a block diagram of an NVM update system and sequence 300 which use an execution NVM 310 (e.g., a first NVM bank of n m-byte blocks) for storing uncompressed execution code and a smaller NVM 320 (e.g., a second NVM bank of n p-byte blocks, where m>p) for storing compressed update or backup code. In a first step of this example sequence, a step counter j is initialized (e.g., j=1) and a jth block of compressed update/backup code from the smaller NVM 320 is loaded into scratch NVM 303, where the jth block loaded into the scratch NVM 303 is p-bytes of compressed update/backup code. In the next step, a jth block of uncompressed execution code from the execution NVM 310 is loaded into scratch SRAM 304 (step 2), where the jth block loaded into scratch SRAM 304 is m-bytes of uncompressed execution code. At step 3, the jth m-byte block of uncompressed execution code from scratch SRAM 304 is compressed into a p-byte block of compressed code using the lossless compression engine 301, and the resulting compressed code is written into block j of the smaller NVM 320 at step 4. At or about the same time, the jth p-byte block of compressed update/backup code from scratch NVM 303 is decompressed into an m-byte block of decompressed code at step 5 using the lossless decompression engine 302, and at step 6, the resulting decompressed code is written into block j of the execution NVM 310 that was vacated at step 2 when the jth block of uncompressed execution code from the execution NVM 310 was loaded into scratch SRAM 304. After incrementing the value of the step counter j, steps 1-6 are iteratively repeated until j=n blocks of p-byte compressed code from the smaller NVM 320 have been decompressed and swapped with all n of the m-byte blocks of the decompressed code originally stored in the execution NVM storage 310.

As seen from the foregoing, the disclosed block-based swapping of the update software requires that the system software be disabled or suspended from operation while the execution code blocks in the execution NVM 310 are replaced with decompressed blocks from the smaller NVM 320. By sequencing the update operations so that the compression/decompression operations are applied to individual blocks of code, the time required for compression/decompression operations 301, 302 is effectively hidden within the NVM write operations (e.g., steps 4 and 6), thereby minimizing the down time required to swap the execution code with the update/backup code. To provide an illustrative example, approximately 400 ms of downtime is required to update execution code stored in a first 16 MB embedded NVM 310 using a OTA code stored in a second 8 MB embedded NVM 320 by using a compressor that provides 50% lossless compression, a scratch SRAM 304 having a SRAM read/wr=5 ns, a scratch NVM 303 having a NVM rd=20 ns and NVM wr=100 ns, and x64 rd/wr, in which case the SRAM write and read operations will require 2M*10 ns, the NVM write operations will require 1.5*2M*100 ns, and the NVM read operations will require 1.5*2M*20 ns. While this code switching time is slightly slower than conventional "A/B" approaches, any such delays will not be noticeable with NVM memories that employ advanced disruptive memory designs, such as OxRAM, CBRAM, PCRAM, MRAM, and the like. In addition, the cost of any such switching delays must be balanced against the significant area savings from using a smaller NVM 320 to achieve net die savings of approximately 10-20% of the die area used by the NVM, even taking into account the additional die area required for compression/decompression logic and scratch memory requirements.

Figure 4:
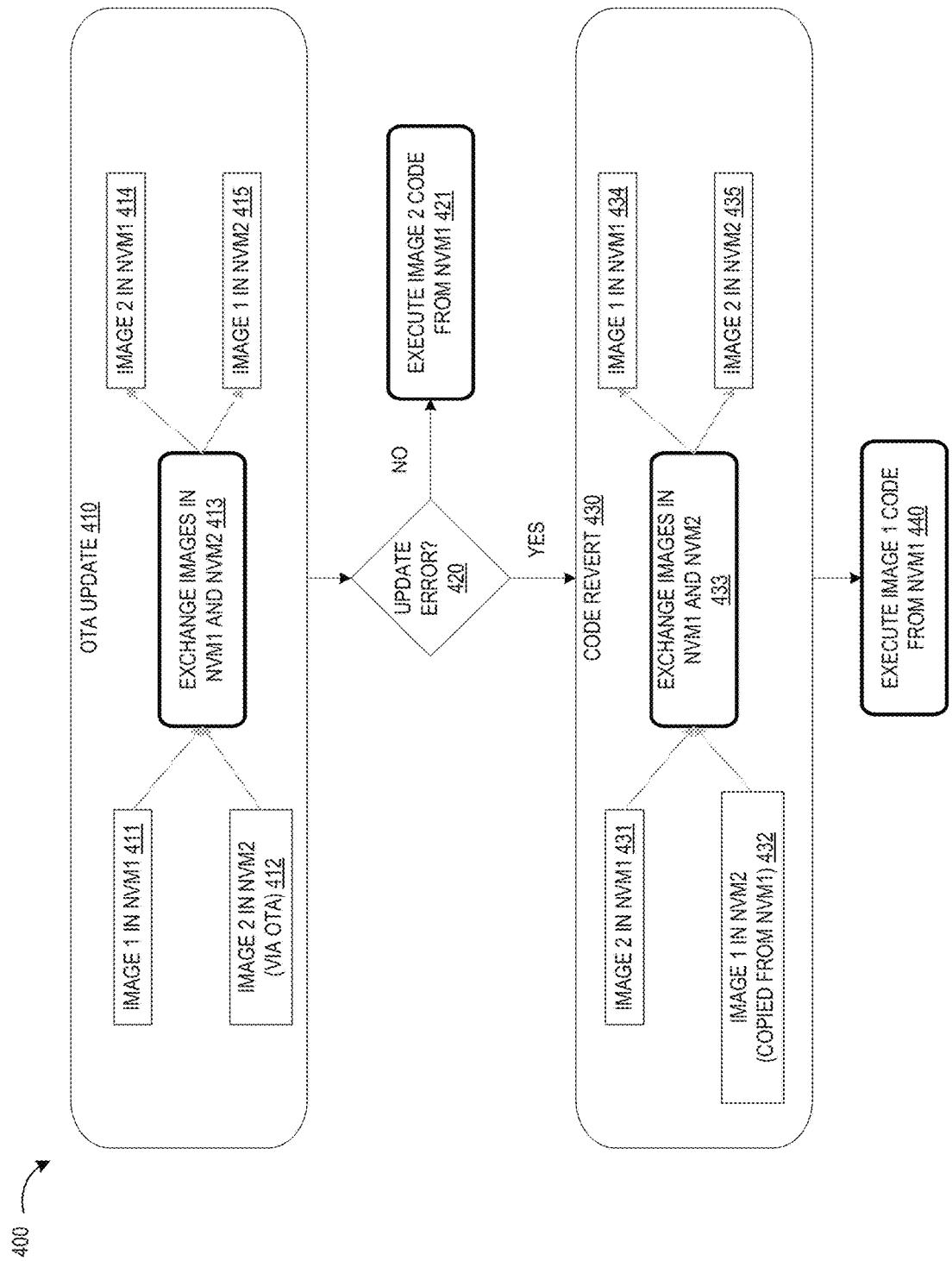
FIG. 4 diagrammatically depicts an image exchange process for using a first NVM bank and a smaller second NVM bank to exchange images for software updates to update execution code with update code from the second smaller NVM bank and for image reversion to restore the original execution code to the first NVM bank in accordance with selected embodiments of the present disclosure.

One of the benefits of the disclosed NVM architecture is that execution code stored in a first NVM can be replaced with OTA update code stored in a smaller NVM without ever losing a copy of the original execution code since it is swapped for storage on a block-by-block basis in the smaller NVM. The ability to retain access to the original execution code can be useful if there is any error detected in the OTA update code. To illustrate this scenario, reference is now made to FIG. 4 which diagrammatically depicts an image exchange process 400 for using a first NVM bank and a smaller second NVM bank in an OTA update process 410, and then to reverse the process in a code revert process 430. During the OTA update process 410, a first image (Image 1) stored in the first NVM bank 411 and a second image (Image 2) stored in the smaller second NVM bank 412 are exchanged at step 413 using lossless compression/decompression techniques to sequentially exchange decompressed blocks from the smaller second NVM bank 412 with compressed blocks from the first NVM bank 411. As a result of swapping blocks between the first and second NVMs, a second image (Image 2) of updated, decompressed execution code is stored in the first NVM bank 414, and the first image (Image 1) of the compressed original execution code is stored in the smaller second NVM bank 415.

At step 420, the updated execution code may be evaluated to determine if there are any errors or defects. If there are no errors (negative outcome to detection step 420), then the updated execution code (Image 2) in the first NVM is executed by the system (step 421). However, if there is an error with the new code (affirmative outcome to detection step 420), then an image reversion process is started with the code reversion process 430 to restore the original execution code to the first NVM bank. During the code restoration 430, the (uncompressed) second image (Image 2) stored in the first NVM bank 431 and the (compressed) first image (Image 1) stored in the smaller second NVM bank 432 are exchanged at step 433 using lossless compression/decompression techniques to sequentially exchange decompressed blocks from the smaller second NVM bank 432 with compressed blocks from the first NVM bank 431. As a result of swapping blocks between the first and second NVMs, a first image (Image 1) of original or non-updated execution code is stored in uncompressed form in the first NVM bank 434, and the second image (Image 2) of the compressed OTA update code is stored in the smaller second NVM bank 435. Having reloaded the original or non-updated execution code into the first NVM bank 434, the non-updated execution code (Image 1) in the first NVM is executed by the system (step 440), the process ends An NVM architecture, system, apparatus, and methodology are described for supporting over-the-air (OTA) updates for code stored in nonvolatile memory of a system-on-chip which reduces the size of backup NVM storage to half of the primary NVM storage without adding big delay time for changing the executable code once the OTA update is finished by using compression/decompression techniques with scratch memories to store swapped blocks of NVM code for compression and decompression, thereby hiding the compression/decompression time within the time required to write from the scratch memories to the primary and backup NVM storage. By storing the current executable code in the primary NVM storage and storing compressed update or backup code in the smaller backup NVM storage, software update processing is efficiently supported with good switching times while retaining a copy of the original execution code in compressed form in case there is a need to revert back to the original, non-updated code. In disclosing the claimed apparatus, system, and method for performing software update and/or reversion processing with a primary NVM storage and a 50% smaller backup NVM storage by using individually configurable rules, rather than humans, to perform block-based swapping of compressed/decompressed blocks stored in scratch memory, there is disclosed an improvement in computer-related technology for improving the design, increasing the performance, and reducing the cost for performing software update or maintenance tasks.

Some of the above embodiments, as applicable, may be implemented using a variety of different system architectures. For example, although FIG. 2 and the discussion thereof describe an exemplary vehicle system architecture that is designed with a high degree of security in mind wherein an OTA manager controls one or more ECUs to implement a memory-efficient software update at each ECU, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

By now it should be appreciated that there has been provided a software update architecture, system, apparatus, and methodology for performing block-based swapping of update software stored as a plurality of compressed blocks with the system software stored as a plurality of decompressed blocks. In the disclosed embodiments, over-the-air (OTA) software is received over a communications link at a device which includes a first NVM and second NVM. In selected embodiments, the first NVM stores n m-byte blocks of decompressed code, and the second, smaller NVM stores n p-byte blocks of compressed code, where m>p. The first NVM is operably disposed for storing system software that is run on the device and that includes a plurality of first code blocks that are not compressed. The second NVM is smaller than the first NVM (e.g., half as large), and is operably disposed for storing the OTA software that includes a plurality of second code blocks that are compressed. After storing the received OTA software in the second (smaller) NVM, the device performs block-based swapping of the OTA software in the second NVM with the system software in the first NVM. In particular, the block-based swapping may use a first decompressor circuit to sequentially decompress each of the plurality of (compressed) second code blocks of the OTA software for storage in decompressed form as updated system software in the first nonvolatile memory while, in a sequential fashion, a first compressor circuit sequentially compresses each of the plurality of (decompressed) first code blocks of the system software for storage in compressed form as backup system software in the second NVM. In the course of performing block-based swapping, the plurality of second code blocks from the second NVM are sequentially loaded into a first scratch memory and lossless decompression is performed on each loaded second code block to generate a decompressed code block for storage in the first nonvolatile memory. In addition, the block-based swapping may also include sequentially loading each of the plurality of first code blocks from the first NVM into a second scratch memory and performing lossless compression on each loaded first code block to generate a compressed code block for storage in the second NVM. In selected embodiments, the first scratch memory may be embodied as a scratch nonvolatile memory, and the second scratch memory may be embodied as a scratch static random access memory (SRAM). If there is no error detected in the update system software, the updated system software stored in the first NVM is executed after performing block-based swapping of the OTA software with the system software. However, if an error is detected, the system software may be reloaded into the first NVM by performing block-based swapping of the backup system software in the second NVM with the updated system software in the first NVM using the first decompressor circuit to sequentially decompress each block of backup system software stored in the second NVM for storage in decompressed form in the first NVM while, in a sequential fashion, the first compressor circuit sequentially compresses each block of updated system software stored in the first NVM for storage in compressed form in the second NVM.

In another form, there is provided a method, architecture and method of operation wherein there is provided a first nonvolatile memory for storing system software as a first plurality of uncompressed code blocks that run on the device. In addition, a second, smaller nonvolatile memory is provided for storing update software comprising a second plurality of compressed code blocks. In selected embodiments, the second, smaller nonvolatile memory may be half the size of the first nonvolatile memory. In other embodiments, the first nonvolatile memory stores n m-byte uncompressed code blocks, and the second, smaller nonvolatile memory stores n p-byte compressed code blocks, where m>p. In addition, there is provided a first scratch memory (e.g., scratch NVM) for storing a compressed code block and a second scratch memory (e.g., scratch SRAM) for storing an uncompressed code block, along with a decompressor circuit and a compressor circuit. In instruction memory, instructions are stored which are executable and configured to perform block-based swapping of the update software in the second, smaller nonvolatile memory with the system software in the first nonvolatile memory. This is implemented by sequentially transferring each of the second plurality of compressed code blocks into the first scratch memory while sequentially transferring each of the first plurality of uncompressed code blocks into the second scratch memory. As each code block is transferred, commands are issued to the decompressor circuit and compressor circuit to sequentially decompress each compressed code block in the first scratch memory for storage in uncompressed form as updated system software in the first nonvolatile memory while sequentially compressing a corresponding uncompressed code block in the second scratch memory for storage in compressed form as backup system software in the second, smaller nonvolatile memory. For example, the commands may be issued by issuing a first command to the compressor circuit to compress an uncompressed code block in the second scratch memory for storage in compressed form in the second, smaller nonvolatile memory, and then issuing a second command to the decompressor circuit to decompress a compressed code block in the first scratch memory for storage in uncompressed form in the first nonvolatile memory. In selected embodiments, the decompressor circuit is a lossless decompressor circuit which sequentially loads each of the second plurality of compressed code blocks from the first scratch memory and performs lossless decompression on each compressed code block to generate an uncompressed code block for storage in the first nonvolatile memory. In other embodiments, the compressor circuit is a lossless compressor circuit which sequentially loads each of the first plurality of uncompressed code blocks from the second scratch memory and performs lossless compression on each uncompressed code block to generate a compressed code block for storage in the second, smaller nonvolatile memory.

In yet another form, there is provided a nonvolatile memory architecture and associated method of operation. In the disclosed NVM architecture, a non-volatile memory (NVM) is provided that includes a first NVM array which stores execution software as a first plurality of uncompressed code blocks and a second, smaller NVM array which stores compressed software as a second plurality of compressed code blocks. In selected embodiments, the second, smaller NVM array is half the size of the first NVM array. In other embodiments, the first NVM array stores n m-byte uncompressed code blocks and the second, smaller NVM array stores n p-byte compressed code blocks, where m>p. In yet other embodiments, the first NVM array may store i m-byte uncompressed code blocks, and the second, smaller NVM array may store j p-byte compressed code blocks, where i≠j, and where m>p. The disclosed NVM architecture also includes a first scratch memory (e.g., scratch NVM) for storing a compressed code block, and a second scratch memory (e.g., scratch SRAM) for storing an uncompressed code block. In addition, the disclosed NVM architecture includes a decompressor circuit and a compressor circuit. In the disclosed NVM architecture, the decompressor circuit is connected to decompress each of the second plurality of compressed code blocks that is sequentially loaded from the first NVM array into the first scratch memory for storage in uncompressed form as updated execution software in the first NVM array in concert with the compressor circuit which is connected to compress each of the first plurality of uncompressed code blocks that is sequentially loaded into the second scratch memory for storage in compressed form as backup system software in the second, smaller NVM array, thereby performing block-based swapping of the compressed software in the second, smaller NVM array with the execution software in the first NVM array. In selected embodiments, the decompressor circuit is a lossless decompressor circuit which sequentially loads each of the second plurality of compressed code blocks from the first scratch memory and performs lossless decompression on each compressed code block to generate an uncompressed code block for storage in the first NVM array. In other embodiments, the compressor circuit is a lossless compressor circuit which sequentially loads each of the first plurality of uncompressed code blocks from the second scratch memory and performs lossless compression on each uncompressed code block to generate a compressed code block for storage in the second, smaller NVM array.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Although the described exemplary embodiments disclosed herein are directed to an exemplary soft bit computation engine, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A software update method comprising:
  receiving over-the-air (OTA) software over a communications link at a device comprising:
    a first nonvolatile memory operably disposed in the device for storing system software that is run on the device, the system software comprising a plurality of first code blocks that are not compressed,
    a second, smaller nonvolatile memory operably disposed in the device for storing the OTA software, the OTA software comprising a plurality of second code blocks that are compressed, and
    a first decompressor circuit and a first compressor circuit;
  storing received OTA software in the second, smaller nonvolatile memory; and
  performing, by the device, block-based swapping of the OTA software in the second, smaller nonvolatile memory with the system software in the first nonvolatile memory, wherein
    said block-based swapping uses the first decompressor circuit of the device to sequentially decompress each of the plurality of second code blocks of the OTA software for storage in decompressed form as updated system software in the first nonvolatile memory while, in a sequential fashion, the first compressor circuit of the device to sequentially compresses each of the plurality of first code blocks of the system software for storage in compressed form as backup system software in the second, smaller nonvolatile memory, and
    said performing the block-based swapping comprises sequentially loading each of the plurality of second code blocks from the second, smaller nonvolatile memory into a first scratch memory of the device, and performing lossless decompression on each loaded second code block to generate a decompressed code block for storage in the first nonvolatile memory.

2. The software update method of claim 1, further comprising executing the updated system software stored in the first nonvolatile memory after performing block-based swapping of the OTA software with the system software.

3. The software update method of claim 1, further comprising reloading the system software into the first nonvolatile memory upon detecting an error in the updated system software by performing block-based swapping of the backup system software in the second, smaller nonvolatile memory with the updated system software in the first nonvolatile memory using the first decompressor circuit to sequentially decompress each block of backup system software stored in the second, smaller nonvolatile memory for storage in decompressed form in the first nonvolatile memory while, in a sequential fashion, the first compressor circuit sequentially compresses each block of updated system software stored in the first nonvolatile memory for storage in compressed form in the second, smaller nonvolatile memory.

4. The software update method of claim 1, where the second, smaller nonvolatile memory is half as large as the first nonvolatile memory.

5. The software update method of claim 1, wherein
  the first nonvolatile memory stores n m-byte blocks of decompressed code,
  the second, smaller nonvolatile memory stores n p-byte blocks of compressed code, and
  m>p, where m, n, and p are positive integers.

6. The software update method of claim 1, where performing block-based swapping comprises sequentially loading each of the plurality of first code blocks from the first nonvolatile memory into a second scratch memory of the device and performing lossless compression on each loaded first code block to generate a compressed code block for storage in the second, smaller nonvolatile memory.

7. The software update method of claim 6, where the first scratch memory comprises a scratch nonvolatile memory, and where the second scratch memory comprises a scratch static random access memory (SRAM).

8. A device comprising:
  a first nonvolatile memory storing system software as a first plurality of uncompressed code blocks that run on the device;
  a second, smaller nonvolatile memory storing update software comprising a second plurality of compressed code blocks;
  a first scratch memory for storing a compressed code block;
  a second scratch memory for storing an uncompressed code block;
  a decompressor circuit, wherein the decompressor circuit of the device comprises a lossless decompressor circuit configured to sequentially load each of the second plurality of compressed code blocks from the first scratch memory and perform lossless decompression on each compressed code block to generate an uncompressed code block for storage in the first nonvolatile memory;

a compressor circuit; and instruction memory for storing instructions which are executable and configured to perform block-based swapping of the update software in the second, smaller nonvolatile memory with the system software in the first nonvolatile memory by:

sequentially transferring each of the second plurality of compressed code blocks into the first scratch memory while sequentially transferring each of the first plurality of uncompressed code blocks into the second scratch memory, and issuing commands to the decompressor circuit of the device and compressor circuit of the device to sequentially decompress each compressed code block in the first scratch memory for storage in uncompressed form as updated system software in the first nonvolatile memory while sequentially compressing a corresponding uncompressed code block in the second scratch memory for storage in compressed form as backup system software in the second, smaller nonvolatile memory.

9. The device of claim 8, where the first scratch memory comprises a scratch nonvolatile memory, and where the second scratch memory comprises a scratch static random access memory (SRAM).

10. The device of claim 8, where the second, smaller nonvolatile memory is half the size of the first nonvolatile memory.

11. The device of claim 8, wherein the first nonvolatile memory stores n m-byte uncompressed code blocks, the second, smaller nonvolatile memory stores n p-byte compressed code blocks, and m>p, where m, n, and p are positive integers.

12. The device of claim 8, where the compressor circuit of the device comprises a lossless compressor circuit which sequentially loads each of the first plurality of uncompressed code blocks from the second scratch memory and performs lossless compression on each uncompressed code block to generate a compressed code block for storage in the second, smaller nonvolatile memory.

13. The device of claim 8, where issuing commands comprises issuing a first command to the compressor circuit of the device to compress an uncompressed code block in the second scratch memory for storage in compressed form in the second, smaller nonvolatile memory, and then issuing a second command to the decompressor circuit of the device to decompress a compressed code block in the first scratch memory for storage in uncompressed form in the first nonvolatile memory.

14. A nonvolatile memory architecture comprising:

a non-volatile memory (NVM) comprising a first NVM array which stores execution software as a first plurality of uncompressed code blocks and a second, smaller NVM array which stores compressed software as a second plurality of compressed code blocks;

a first scratch memory for storing a compressed code block;

a second scratch memory for storing an uncompressed code block;

a decompressor circuit coupled to the first NVM array and the first scratch memory, wherein the decompressor circuit comprises a lossless decompressor circuit configured to sequentially load each of the second plurality of compressed code blocks from the first scratch memory, and perform lossless decompression on each compressed code block to generate an uncompressed code block for storage in the first NVM array; and a compressor circuit coupled to the second NVM array and the second scratch memory;

wherein the decompressor circuit is connected to decompress each of the second plurality of compressed code blocks that is sequentially loaded from the first NVM array into the first scratch memory for storage in uncompressed form as updated execution software in the first NVM array in concert with the compressor circuit which is connected to compress each of the first plurality of uncompressed code blocks that is sequentially loaded into the second scratch memory for storage in compressed form as backup system software in the second, smaller NVM array, thereby performing block-based swapping of the compressed software in the second, smaller NVM array with the execution software in the first NVM array.

15. The nonvolatile memory architecture of claim 14, where the first scratch memory comprises a scratch nonvolatile memory, and where the second scratch memory comprises a scratch static random access memory (SRAM).

16. The nonvolatile memory architecture of claim 15, where the second, smaller NVM array is half the size of the first NVM array.

17. The nonvolatile memory architecture of claim 16, wherein the first NVM array stores n m-byte uncompressed code blocks, the second, smaller NVM array stores n p-byte compressed code blocks, and m>p, where m, n, and p are positive integers.

18. The nonvolatile memory architecture of claim 14, where the compressor circuit comprises a lossless compressor circuit which sequentially loads each of the first plurality of uncompressed code blocks from the second scratch memory and performs lossless compression on each uncompressed code block to generate a compressed code block for storage in the second, smaller NVM array.

* * * * *